US006310487B1

(12) United States Patent
Yokomizo

(10) Patent No.: US 6,310,487 B1
(45) Date of Patent: Oct. 30, 2001

(54) SEMICONDUCTOR INTEGRATED CIRCUIT AND TESTING METHOD THEREOF

(75) Inventor: Koichi Yokomizo, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/286,663

(22) Filed: Apr. 6, 1999

(30) Foreign Application Priority Data

Dec. 10, 1998 (JP) .................................................. 10-351578

(51) Int. Cl.[7] .................................................. G01R 31/26
(52) U.S. Cl. .......................................... 324/769; 324/765
(58) Field of Search .................................. 324/769, 763, 324/765, 158.1, 537, 538

(56) References Cited

U.S. PATENT DOCUMENTS

| 5,917,333 | * | 6/1999 | Ogawa | 324/769 |
| 5,942,910 | * | 8/1999 | Nguyen | 324/769 |

FOREIGN PATENT DOCUMENTS

| 6-334010 | 12/1994 | (JP) . |
| 9-8645 | 1/1997 | (JP) . |
| 09046212 | 2/1997 | (JP) . |
| 09064715 | 3/1997 | (JP) . |
| 09198870 | 7/1997 | (JP) . |
| 09321600 | 12/1997 | (JP) . |
| 10032481 | 2/1998 | (JP) . |
| 10135814 | 5/1998 | (JP) . |
| 10187270 | 7/1998 | (JP) . |
| 10-242839 | 9/1998 | (JP) . |

* cited by examiner

Primary Examiner—Glenn W. Brown
Assistant Examiner—J Kerveros
(74) Attorney, Agent, or Firm—Jones Volentine, PLLC

(57) ABSTRACT

The invention provides a semiconductor integrated circuit wherein a PMOS 111 having a high threshold voltage is installed between a VDD line 101 and a VDDV line 103, and a NMOS 121 having a high threshold voltage is installed between a VSS line 102 and a VSSV line 104. The semiconductor integrated circuit comprises a logic gate circuit supplied with a power source voltage via the VDDV line 103 and the VSSV line 104, respectively, and made up of PMOSes 131 to 133, and NMOSes 141 to 143. A substrate terminal of the PMOSes 131 to 133, respectively, is connected to a pad 163 to which a suitable voltage can be supplied from outside while a substrate terminal of the NMOSes 141 to 143, respectively, is connected to a pad 164 to which a suitable voltage can be supplied from outside. The semiconductor integrated circuit with such a configuration is capable of improving a failure detection ratio at testing.

18 Claims, 9 Drawing Sheets

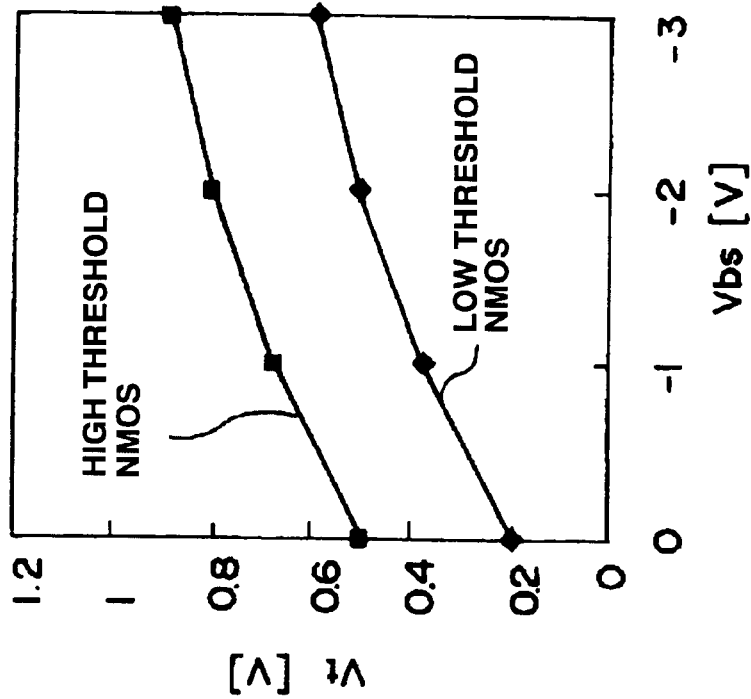
FIG. 2(A) PMOS
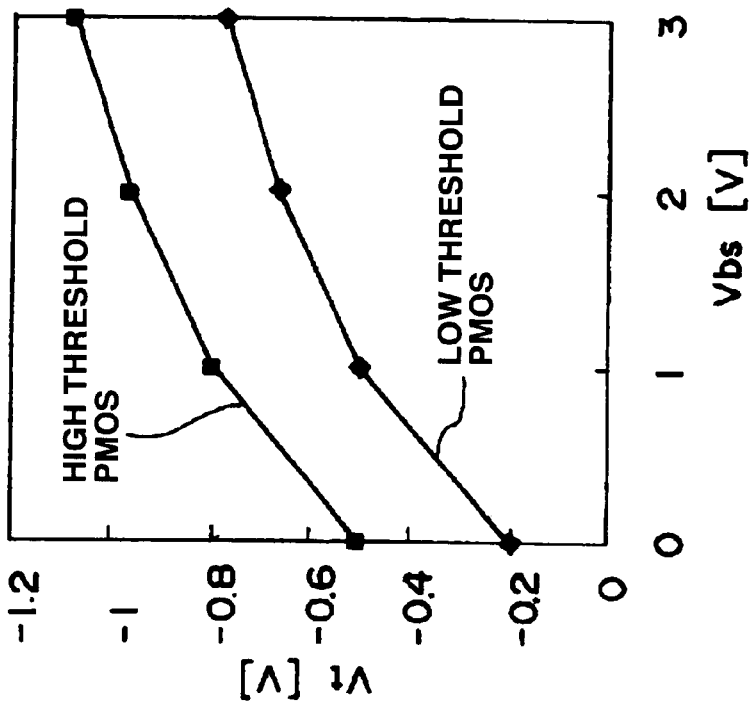
FIG. 2(B) NMOS

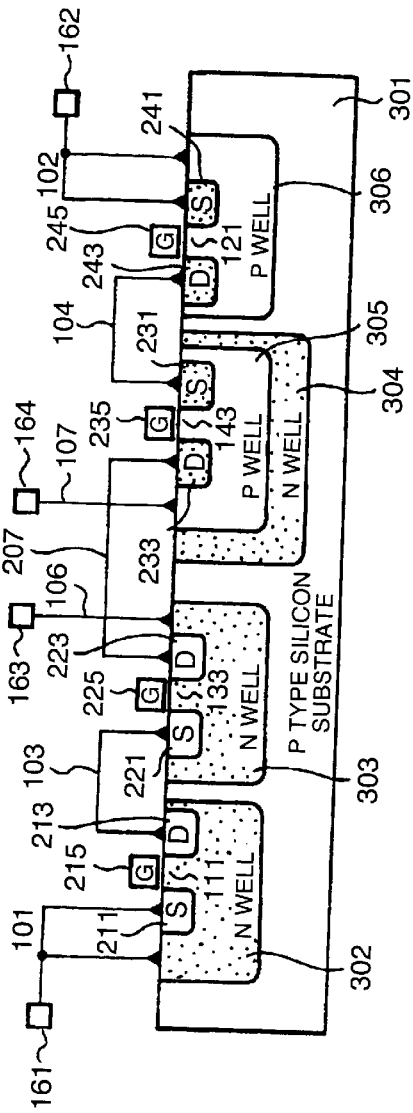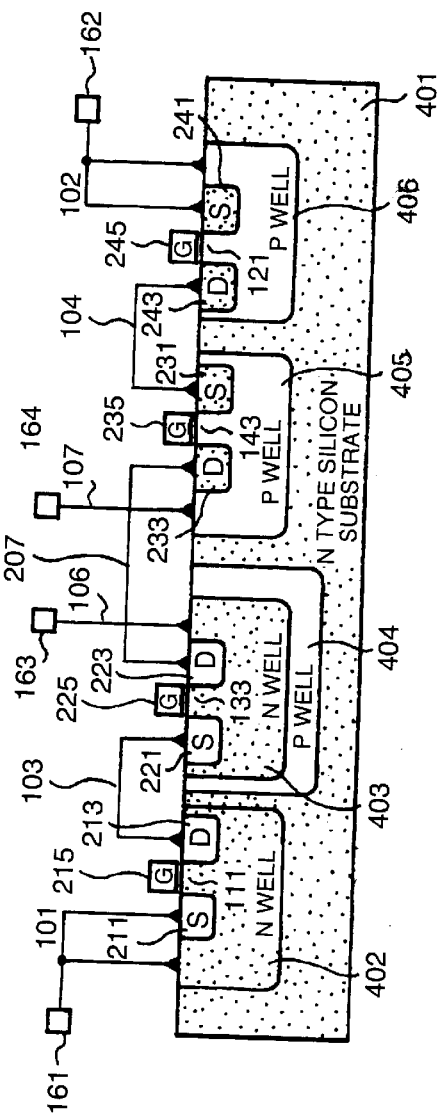

SEMICONDUCTOR INTEGRATED CIRCUIT AND TESTING METHOD THEREOF

BACKGROUND OF THE INVENTION

1. Field of the Invention

The invention relates to a semiconductor integrated circuit made up by integrating a plurality of N channel MOSFETs with a plurality of P channel MOSFETs, and more particularly, to a semiconductor integrated circuit comprising the plurality of the respective channel MOSFETs, each incorporating at least a MOSFET having a different threshold voltage, and also to a testing method thereof.

2. Description of the Related Art

Portable information equipment, typically such as PHS (personal handy-phone system) and PDA (portable data assistant), have recently come into widespread use. A semiconductor integrated circuit (referred to hereinafter as IC) is in use as one of the components of the portable information equipment. There has been a strong demand that the IC can achieve reduction in power consumption without degrading its performance in respect of processing speed.

An IC using the CMOS technology is known for its lower consumption of power in comparison with an IC using the bipolar technology or the EDMOS technology.

However, even with the IC using the CMOS technology, the magnitude of power consumption thereof has come to pose a problem as a result of shift of operation frequencies of ICs to higher frequencies taking place lately.

The power consumption P of a CMOS logic gate circuit in the IC using the CMOS technology is generally approximated by the following expression:

$$P \approx K \cdot C \cdot Vdd^2 \cdot f + I_{leak} \cdot Vdd \qquad (1)$$

where

K=switching probability,
C=output load capacity of the CMOS logic gate circuit,
Vdd=power source voltage,
f=operation frequency, and
I leak=subthreshold leak current.

The subthreshold leak current will be further described hereinafter. A symbol "·" in expression (1) denotes multiplication, and the same applies to other expressions referred to later.

When the IC is in an operating mode (for example, when the CMOS logic gate circuit is in an operating state upon supply of a clock signal of a given frequency thereto), a first term of the expression (1) becomes dominant, and power consumption thereof will be proportional to the square of the power source voltage Vdd. On the other hand, when the IC is in a standby mode (when the operation of the CMOS logic gate circuit is in a suspended state upon supply of a clock signal thereto being inhibited), a second term of the expression (1) becomes dominant since the operation frequency turns to zero. As is evident from the expression (1), by lowering the power source voltage Vdd, the power consumption, particularly when the IC is in an operating mode, can be significantly reduced. Accordingly, there has been an increasing demand for ICs used in portable information equipment that can be operated at lower power source voltages.

As described in the foregoing, the power consumption of the IC can be reduced by lowering the power source voltage Vdd. However, the power source voltage Vdd at a reduced level results in an increase of gate propagation delay time tpd of the CMOS logic gate circuit making up the IC. The gate propagation delay time tpd of the CMOS logic gate circuits is generally approximated by the following expression:

$$tpd = C \cdot Vdd/(Vdd - Vt)^\alpha \qquad (2)$$

where

C=output load capacity of the CMOS logic gate circuit,
Vdd=power source voltage,
Vt=threshold voltage of switching MOSFETs, and
α=factor determined, depending on the generation of a device, $1 \leq \alpha \leq 2$.

As is evident from the expression (2), the power source voltage Vdd at a reduced level results in a gradual increase of the gate propagation delay time tpd. It is further shown that if the power source voltage Vdd is lowered close to the threshold voltage Vt of a MOSFET, a denominator on the right side of the expression (2) becomes small in value, resulting in a significant increase in the gate propagation delay time tpd. It follows therefore that the threshold voltage Vt of the MOSFET needs to be lowered according as the power source voltage Vdd is lowered in order that the power source voltage Vdd is lowered without causing an increase in the gate propagation delay time tpd.

Meanwhile, as indicated by the second term of the expression (1), the power consumption (referred to hereinafter as standby power consumption) of the CMOS logic gate circuits when the IC is in a standby mode is substantially determined by leak current $I_{leak}$ (referred to generally as subthreshold leak current) occurring when a voltage between the gate and the source of the MOSFET is at 0V. The subthreshold leak current $I_{leak}$ is generally approximated by the following expression:

$$I_{leak} \exp\{-Vt(S/\ln 10)\} \qquad (3)$$

where

Vt=the threshold voltage of a MOSFET, and
S=subthreshold factor, one of numerical values indicating the characteristics of a MOSFET, and more specifically, a numerical value indicating the current-voltage characteristic in a region where a voltage between the gate and the source of the MOSFET is not higher than the threshold voltage Vt. With MOSFETs of the submicron order, the numerical value is generally on the order of 80 to 90 mV/decade.

As is evident from the expression (3), it is shown that if the threshold voltage Vt is set at low levels, the subthreshold leak current $I_{leak}$ will increase exponentially. For example, if the threshold voltage of a MOSFET making up an IC comprising a CMOS logic gate circuit is lowered by 0.3V, this will result in an increase of the subthreshold leak current $I_{leak}$ occurring when the IC is in a standby mode by three or four orders of magnitude.

As described in the foregoing, there is a trade-off relationship between the subthreshold leak current $I_{leak}$ when the threshold voltage Vt is changed and the gate propagation delay time tpd. With ICs comprising a CMOS logic gate circuit, the threshold voltage Vt is generally set such that the gate propagation delay time tpd as required can be achieved while meeting the standby power consumption as allowed in product specification and so forth. It has become extremely difficult, however, to reconcile the subthreshold leak current $I_{leak}$ which is satisfactory with the gate propagation delay time tpd which is also satisfactory in the face of the recent demand for lowering the power source voltage Vdd.

In connection with the CMOS technology, there has been disclosed in the following literature a technology whereby the standby power consumption can be reduced without sacrificing operation speed characteristic (for example, the gate propagation delay time tpd); the title of the literature: "1-V Power Supply High-Speed Digital Circuit Technology with Multithreshold-Voltage CMOS". IEEE Journal of Solid-State Circuits 30 [8], pp. 847–854, 1995

The technology disclosed in the literature described above is called a Multi-Threshold Voltage CMOS (referred to hereinafter as MT CMOS) technology. The MT CMOS technology disclosed in the literature described above will be briefly described hereinafter.

In an IC using the MT CMOS technology, a power source voltage is supplied to the logic gate circuit thereof via a pseudo power source voltage line on the high potential side and a pseudo power source voltage line on the low potential side.

The logic gate circuit comprises P channel MOSFETs and N channel MOS FETs, both having low threshold voltages. A power source voltage on the high potential side is supplied to the pseudo power source voltage line on the high potential side via a switch made up of a P channel MOS FET having a threshold voltage higher than that of the P channel MOS FETs making up the logic gate circuit. A power source voltage on the low potential side is supplied to the pseudo power source voltage line on the low potential side via a switch made up of a N channel MOSFET having a threshold voltage higher than that of the N channel MOSFETs making up the logic gate circuit.

When the N channel MOSFETs making up the IC and the switch made up of the N channel MOSFET are looked at as four-terminal devices, each having terminals such as the drain, source, gate, and substrate, the power source voltage on the low potential side is supplied to the substrate terminal of the respective N channel MOSFETs via a P well layer or a P type semiconductor substrate (if a P type semiconductor substrate is in use).

Also, when the P channel MOSFETs making up the IC and the switch made up of the P channel MOSFET are looked at as four-terminal devices, each having terminals such as the drain, source, gate, and substrate, the power source voltage on the high potential side is supplied to the substrate terminal of the respective P channel MOSFETs via a N well layer or a N type semiconductor substrate (if a N type semiconductor substrate is in use).

When the IC using the MT CMOS technology, having the configuration described above, is in an operating mode, the N channel MOSFET and the P channel MOSFET serving as switches are turned to a conducting state. Accordingly, the pseudo power source voltage line on the high potential side will be at a potential substantially equivalent to the power source voltage on the high potential side due to the power source voltage on the high potential side supplied via the P channel MOSFET acting as a switch. Similarly, the pseudo power source voltage line on the low potential side will be at a potential substantially equivalent to the power source voltage on the low potential side due to the power source voltage on the low potential side supplied via the N channel MOSFET acting as a switch. Thus, the logic gate circuit is supplied with the power source voltage on the high potential side and the power source voltage on the low potential side, respectively, enabling logic operation as desired to be performed.

Since the threshold voltage of the N channel MOSFETs and the P channel MOSFETs, making up the logic gate circuit, are set at low levels, operation can be performed at a low power source voltage Vdd without causing an increase in the gate propagation delay time tpd in contrast to a case where the N channel MOSFETs and the P channel MOSFETs, having high threshold voltages, are used. That is, with this type of IC, power consumption when the IC is in an operating mode can be reduced while maintaining speed performance equivalent to that for a case where the N channel MOSFETs and the P channel MOSFETs, having high threshold voltages, are used in the logic gate circuit.

With the IC in a standby mode, the N channel MOSFET and the P channel MOSFET serving as switches are turned to a nonconducting state. Accordingly, magnitude of the subthreshold leak current $I_{leak}$ flowing from the power source voltage on the high potential side to the power source voltage on the low potential side will be determined depending on the subthreshold current characteristic of the N channel MOSFET and the P channel MOSFET, making up the switches described above, in a nonconducting state. As described in the foregoing, since the threshold voltage of the N channel MOSFET and that of the P channel MOSFET, respectively, making up the switches, are set at high levels, the subthreshold leak current $I_{leak}$ can be made small in value. That is, although the logic gate circuit is made up of MOSFETs having low threshold voltages, the subthreshold leak current $I_{leak}$ can be made equivalent in value to that for a case where the logic gate circuit is made up of MOSFETs having high threshold voltages.

As described hereinbefore, with the IC using the MT CMOS technology, it will be possible to reduce power consumption in an operating mode by lowering the power source voltage Vdd, to maintain delay performance without increasing the gate propagation delay time tpd of the logic gate circuit, and to reduce the standby power consumption due to the effect of the subthreshold leak current when in an standby mode.

The IC using the MT CMOS technology has excellent characteristics as described above, but is faced with a problem of concern at the time of testing. That is, an IDDQ test which has recently been brought into use for testing products on a mass production basis prior to shipment in order to improve a failure detection ratio of large scale logic ICs, in particular, is not applicable thereto.

The IDDQ test takes advantage of the characteristics of a logic gate circuit, made up of MOSFETs having high threshold voltages, whereby in the case of conforming products, a power source current IDD (current flowing from the power source voltage on the high potential side to the power source voltage on the low potential side) is only a leak current of very small magnitude (for example, in the range of several nA to several tens $\mu$A for the whole IC), determined by the subthreshold leak current of the respective MOSFETs when the MOSFETs, making up the logic gate circuit, are not in a state of switching operation.

More specifically, in several patterns of stable conditions wherein the output voltage of respective logic gate circuits within the IC is set at a high level or a low level, a current value of the power source current IDD is measured. In case of a measured current value of the power source current IDD being sufficiently greater than a preestimated current value of the leak current, it can be determined that something abnormal (shorts between connections, breaks in connections, and so forth) has occurred inside the IC. That is, by measuring the power source current IDD when the IC is in a standby mode, any physical defect inside the IC can be detected.

In a common 0.25 $\mu$m class IC using the CMOS technology, with 100,000 gates integrated therein, the power source current IDD, dependent on the subthreshold leak current, is on the order of 100 nA to 10 $\mu$A when the threshold voltage value of the N channel MOSFETs and the P channel MOSFETs are set at 0.5V and −0.5V, respectively. Meanwhile, in case of abnormality inside the IC, for example, a short between connections, a short current value will increase by orders of magnitude to as much as 100 $\mu$A to 10 mA. As the short current will be superimposed on the power source current IDD, measurement of a current value of the power source current IDD enables detection on whether or not abnormality has occurred inside the IC to be made with ease.

In detection of failure inside the IC, the IDDQ test has a high failure detection ratio in comparison with the conventional logical function test whereby logical output values of the IC against input in the logical test pattern series are checked against estimated logical values, or the conventional function test, making it possible to shorten a test period, and to reduce testing costs. Taking into account a considerable increase in the integration scale of the logical gate circuit, in particular, resulting from miniaturization of the IC production process, the merit of using the IDDQ test is considered tremendous.

Now, the reason why the IDDQ test described in the foregoing can not be applied to the IC using the MT CMOS technology is described hereinafter.

When the IC is in an operating mode, the power source voltage on the high potential side and the power source voltage on the low potential side are supplied to the pseudo power source voltage line on the high potential side and the pseudo power source voltage line on the low potential side, respectively, by turning the P channel MOSFET and the N channel MOSFET, acting as the switches, into a conducting state. Consequently, the logic gate circuits inside the IC will be in a state enabling logic operation, and an output voltage of the respective logic gate circuits can be set at a high voltage level or a low voltage level. However, since the logic gate circuits of the IC using the MT CMOS technology are made up of MOSFETs having a low threshold voltage, the subthreshold leak current of the respective MOSFETs will become large in value. This causes the power source current IDD for the whole IC to become fairly large even when the IC is not in a state of executing logical operation.

For example, in a common 0.25 $\mu$m class IC using the CMOS technology, with 100,000 gates integrated therein, the power source current IDD, dependent on the subthreshold leak current, is on the order of 100 $\mu$A to 10 mA when the threshold voltage value of the N channel MOSFETs and the P channel MOSFETs are set at 0.2V and −0.2V, respectively. Accordingly, even if there should occur failure to a part of the logic gate circuit such as a short between connections, and a resultant short leak current is on the order of 100 $\mu$A to 10 mA, superimposed on the power source current IDD, such a short leak current will be hidden in the power source current IDD, dependent on the subthreshold leak current. As a result, it becomes extremely difficult or impossible to detect failure by measuring the power source current IDD.

Further, when the IC is in a standby mode, the P channel MOSFET and the N channel MOSFET, acting as the switches, are turned into a nonconducting state. Consequently, since neither the power source voltage on the high potential side nor the power source voltage on the low potential side is supplied to the logic gate circuits inside the IC, it is impossible to detect failure, if any, occurring to the logic gate circuits on the basis of the power source current IDD.

As described hereinbefore, with the IC using the MT CMOS technology, the power source current IDD, based on the subthreshold leak current, becomes larger, when in an operating mode, in comparison with that for a IC having logic gate circuits made up of MOSFETs having common high threshold voltages, making it difficult or impossible to detect failure occurring to the logic gate circuits. While in a standby mode, any failure occurring to the logic gate circuits can not be detected on the basis of the power source current IDD.

Thus the IDDQ test can not be applied to the IC using the MT CMOS technology, in particular, to ICs having highly integrated logic gate circuits. This will result in deterioration in a failure detection ratio at pre-delivery tests for products manufactured on a mass production basis, or there will arise needs for additional massive function tests to improve a failure detection ratio, causing an increase in testing time and testing costs.

SUMMARY OF THE INVENTION

It is an object of the invention to provide a semiconductor integrated circuit capable of improving a failure detection ratio to overcome problems described in the foregoing.

It is another object of the invention to provide a semiconductor integrated circuit capable of achieving the object described above while inhibiting an increase in the chip size of the semiconductor integrated circuit.

It is still another object of the invention to provide a method of testing a semiconductor integrated circuit, enabling a failure detection ratio to be improved without causing an increase in testing time and testing costs.

To this end, the invention provides a semiconductor integrated circuit made up by integrating a plurality of first conduction type MOS transistors with a plurality of second conduction type MOS transistors, comprising:

a first power supply line for supplying a first power source voltage;

a first MOS transistor of the plurality of the first conduction type MOS transistors, having a first threshold voltage, and provided with a gate electrode, a first electrode, and a second electrode, the first electrode being connected to the first power supply line;

a first pseudo power supply line connected to the second electrode of the first MOS transistor;

an internal logic circuit comprising at least a second MOS transistor of the plurality of the first conduction type MOS transistors, having a second threshold voltage lower than the first threshold voltage, and supplied with the first power source voltage via the first pseudo power supply line; and a first terminal for supplying a suitable voltage to a substrate terminal of the second MOS transistor.

Also, the semiconductor integrated circuit according to the invention may also comprise:

a second power supply line for supplying a second power source voltage, different from the first power source voltage;

a third MOS transistor of the plurality of the second conduction type MOS transistors, having a third threshold voltage, and provided with a gate electrode, a first electrode, and a second electrode, the first electrode being connected to the second power supply line; and a second pseudo power supply line connected to the second electrode of the third MOS transistor, for supplying the second power source voltage to the internal logic circuit, said internal logic circuit comprising at least a fourth MOS transistor of the plurality of the second conduction type MOS transistors, having a fourth threshold voltage lower than the third threshold voltage.

The semiconductor integrated circuit may further comprise a second terminal for supplying a suitable voltage to a substrate terminal of the fourth MOS transistor.

With the semiconductor integrated circuit according to the invention, the first power source voltage and the second power source voltage may be applied to a substrate terminal of the first MOS transistor and the third power source voltage, respectively, or the first power supply line and the second power supply line may be connected to the substrate terminal of the first MOS transistor and the third power source voltage, respectively.

The semiconductor integrated circuit according to the invention may further comprise a third terminal and a fourth terminal connected to the first power supply line and the second power supply line, respectively, the third terminal and the fourth terminal being connected to the first terminal and the second terminal, respectively, by means of wire bonding.

Further, the semiconductor integrated circuit according to the invention may further comprise a voltage generation circuit for supplying the substrate terminal of the first and the third MOS transistors with a predetermined voltage according to a test signal inputted via the first terminal and the second terminal, respectively.

Still further, with the semiconductor integrated circuit according to the invention, the first and second MOS transistors may be formed in a first well of the second conduction type, formed in a semiconductor substrate, and the first terminal may be connected to the first well, or the first MOS transistor may be formed in a first well of the second conduction type, formed in a second conduction type semiconductor substrate while the second MOS transistor is formed in a third well of the second conduction type, within a second well of the first conduction type, formed in the second conduction type semiconductor substrate, the first terminal being connected to the third well.

Now, with a method of testing a semiconductor integrated circuit, according to the invention, the first power source voltage is supplied to the first power supply line, the first MOS transistor is turned to a conducting state, and a voltage so as to increase a threshold voltage of the second MOS transistor is supplied to the substrate terminal of the second MOS transistor by use of the first terminal before measuring a value of current flowing through the internal logic circuit.

Further, with the method of testing a semiconductor integrated circuit, the first power source voltage may be supplied to the first power supply line, the second power source voltage may be supplied to the second power supply line, the first and third MOS transistors may be turned to a conducting state, a voltage so as to increase the threshold voltage of the second MOS transistor may be supplied to the substrate terminal of the second MOS transistor by use of the first terminal while a voltage so as to increase a threshold voltage of the fourth MOS transistor is supplied to the substrate terminal of the fourth MOS transistor by use of the second terminal before measuring a value of current flowing through the internal logic circuit.

BRIEF DESCRIPTION OF THE DRAWINGS

FIG. 2 shows the general characteristic of a threshold voltage Vt of a MOS FET, dependent on a voltage between the substrate and the source of the MOS FET, Vbs;

FIG. 5 is a sectional view showing the structure of the principal part of the IC according to the second embodiment;

DETAILED DESCRIPTION OF THE PREFERRED EMBODIMENTS

Figure 1:
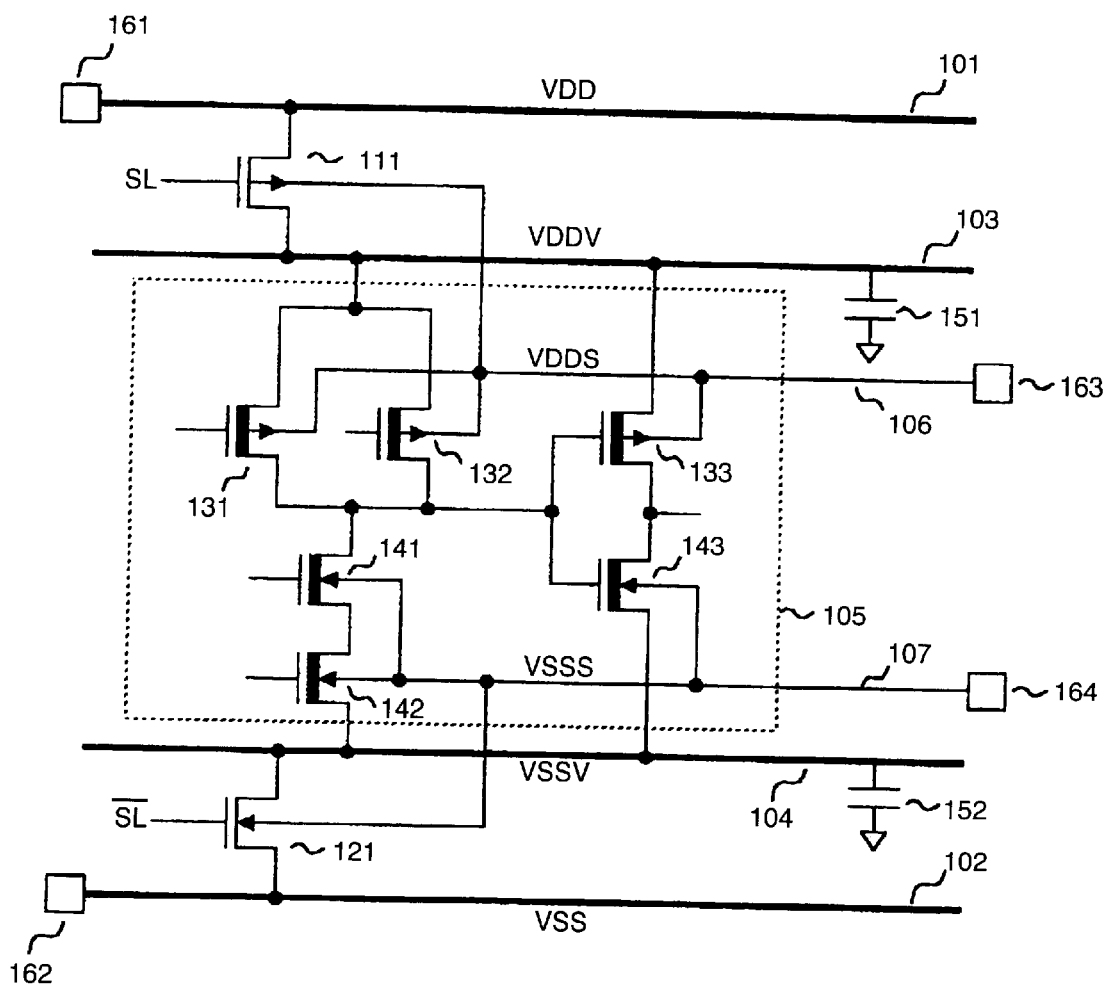
FIG. 1 is a circuit diagram showing the principal part of a semiconductor integrated circuit (IC) according to a first embodiment of the invention.

Preferred embodiments of a semiconductor integrated circuit (IC) and a testing method thereof according to the invention are described hereinafter with reference to the accompanying drawings. FIG. 1 is a circuit diagram showing the principal part of an IC according to a first embodiment of the invention. The MT CMOS technology whereby two types of MOS FETs having different threshold voltages are used for P channel MOS FETs (hereinafter referred to as PMOS), and for N channel MOS FETs (hereinafter referred to as NMOS), respectively, is applied to the IC shown in FIG. 1. In the following description, a threshold voltage Vt of a MOS FET is defined as a voltage value when a voltage Vbs between the substrate and the source of the MOS FET is at 0V unless otherwise described. It is also assumed that an IC in respective embodiments is formed on a silicon substrate.

The IC shown in FIG. 1 comprises a power supply line 101 on the high potential side (referred to hereinafter as VDD line), supplied with a power source voltage on the high potential side, a power supply line 102 on the low potential side (referred to hereinafter as VSS line), supplied with a power source voltage on the low potential side, a pseudo power supply line 103 on the high potential side (referred to hereinafter as VDDV line), and a pseudo power supply line 104 on the low potential side (referred to hereinafter as VSSV line).

As shown in FIG. 1, the IC also comprises a PMOS 111 with one electrode thereof connected to the VDD line 101 and with another electrode connected to the VDDV line 103, and a NMOS 121 with one electrode thereof connected to the VSS line 102 and another electrode connected to the VSSV line 104.

Both the PMOS 111 and the NMOS 121 have high threshold voltages. For example, the threshold voltage Vt of the PMOS 11 is –0.5V while the threshold voltage Vt of the NMOS 121 is 0.5V.

A control signal SL is delivered to the gate electrode of the PMOS 111, and an inverted logical signal SL at a voltage level complementary to the voltage level of the control signal SL is delivered to the gate electrode of the NMOS 121. This means that when the voltage level of the control signal SL is high (at a voltage level in excess of at least the threshold voltage Vt), the PMOS 111 and the NMOS 121 are turned into a conducting state. Accordingly, the VDD line 101 is made electrically continuous with the VDDV line 103, and the VSS line 102 is made electrically continuous with the VSSV line 104. When the voltage level of the control signal SL is low (at a voltage level not exceeding the threshold voltage Vt at the most), however, the PMOS 111 and the NMOS 121 are turned into a nonconducting state. This makes the VDD line 101 electrically discontinuous with the VDDV line 103, and the VSS line 102 electrically discontinuous with the VSSV line 104. That is, the PMOS 111 acts as a switch on the high potential side, and the NMOS 121 acts as a switch on the low potential side.

FIG. 1 shows a CMOS logic gate circuit 105 (referred to hereinafter as logic gate circuit) connected with the VDDV line 103 and the VSSV line 104, respectively.

The logic gate circuit 105 is supplied with the power source voltage on the high potential side via the VDDV line 103 and with the power source voltage on the low potential side via the VSSV line 104.

The logic gate circuit 105 in FIG. 1 is shown to be made up of PMOSes 131 to 133, having a low threshold voltage, respectively, and NMOSes 141 to 143, having a low threshold voltage, respectively. Further, FIG. 1 shows a circuit wherein, for example, the PMOSes 131 and 132 are connected in parallel, the NMOSes 141 and 142 are connected in series, and one of the electrodes of the PMOSes 131, and 132, respectively, are connected to one of the electrodes of the NMOS 141, and a circuit wherein the PMOS 133 is connected in series to the NMOS 143. The other electrode of the PMOSes 131, 132, and 133, respectively, are connected to the VDDV line 103 while the other electrode of the NMOSes 142, and 143, respectively, are connected to the VSSV line 104.

In the figure, connections for input signals delivered to the gate electrode of the PMOSes and the NMOSes, respectively, making up the logic gate circuit 105, are omitted, however, the gate electrodes described are connected to, for example, connections for output signals from other logic gate circuits, and connections for signals from external input terminals. For example, if an identical input signal is delivered to the gate electrode of the PMOS 131 and that of the NMOS 141, and an identical input signal is delivered to the gate electrode of the PMOS 132 and that of the NMOS 142, the PMOSes 131, 132, and the NMOSes 142, 143 can act together as a NAND gate. Also, the PMOS 133 and the NMOS 143 can act together as an inverter.

The logic gate circuit 105 will not be limited to the circuit configuration described above, but various modifications thereof are possible. Further, in practical applications, a number of other logic gate circuits are disposed inside the logic gate circuit 105 of the IC, but for the sake of brevity of the figure and description, only six devices such as the PMOSes 131 to 133 and the NMOSes 141 to 143 are shown in the figure.

As described in the foregoing, the PMOSes 131 to 133 and the NMOSes 141 to 143 have low threshold voltages. The PMOSes 131 to 133 have the threshold voltage Vt thereof at, for example, −0.2V, and the NMOSes 141 to 143 have the threshold voltage Vt thereof at, for example, 0.2V. In the case of the PMOSes, since the threshold voltage Vt of the PMOS 111 is set at −0.5V, the threshold voltage Vt of the PMOSes 131 to 133 appears to be higher if both numerical values are simply compared with each other. However, if comparison is made in terms of the absolute value of these numerical values, representing the magnitude of respective boundary values for enabling the PMOSes to turn to a conducting state as defined by the threshold voltage in the first place, it can be said that the threshold voltage Vt of the PMOSes 131 to 133 is lower.

Capacities 151 and 152, shown in FIG. 1, graphically show capacitance of the VDDV line 103 and the VSSV line 104, respectively, vs. other voltage terminals, connections, and substrates. The capacities 151 and 152 include capacitance parasitically added to the VDDV line 103 and the VSSV line 104, respectively, capacities of capacitive elements, and so forth, purposely connected thereto in order to stabilize voltage values of the VDDV line 103 and the VSSV line 104 when in an operating mode.

Now, when the PMOS 111 acting as the switch on the high potential side and the PMOSes 131 to 133 are looked at as four-terminal devices, each having terminals such as the drain, the gate the source, and the substrate, a substrate terminal of all the PMOSes is connected to a substrate power supply line on the high potential side (referred to hereinafter as VDDS line) 106 via a N type well layer formed in the semiconductor substrate or a N type semiconductor substrate (in the case of an IC using a N type semiconductor substrate). The VDDS line 106 is a power supply line independent of the VDD line 101 and the VDDV line 103 on the semiconductor substrate.

Similarly, when the NMOS 121 acting as the switch on the low potential side and the NMOSes 141 to 143 are looked at as four-terminal devices, each having terminals such as the drain, the gate, the source, and the substrate, a substrate terminal of all the NMOSes is connected to a substrate power supply line on the low potential side (referred to hereinafter as VSSS line) 107 via a P type well layer formed in the semiconductor substrate or a P type semiconductor substrate (in the case of an IC using a P type semiconductor substrate). The VSSS line 107 is a power supply line independent of the VSS line 102 and the VSSV line 104 on the semiconductor substrate.

In FIG. 1, a pad 161 is a terminal provided on the semiconductor substrate for supplying the power source voltage VDD on the high potential side from outside of the IC while a pad 162 is a terminal provided on the semiconductor substrate for supplying the power source voltage VSS on the low potential side from outside of the IC. The pad 161 is connected to the VDD line 101, and the pad 162 is connected to the VSS line 102. The pads 161 and 162 are commonly called power source pads.

In FIG. 1, a pad 163 is a terminal for supplying a substrate voltage to the substrate terminal of the PMOS 111 and the PMOSes 131 to 133, respectively, via the VDDS line 106 while a pad 164 is a terminal for supplying a substrate voltage to the substrate terminal of the NMOS 121 and the NMOSes 141 to 143, respectively, via the VSSS line 107. The pads 163 and 164 are both provided on the semiconductor substrate.

Thus, in the IC shown in FIG. 1, the substrate terminal of the respective PMOSes making up the IC is separated from the VDD line 101, enabling a voltage to be supplied to the substrate terminal to be supplied, for example, from outside of the IC using the pad 163. Similarly, the substrate terminal of the respective NMOSes making up the IC is separated from the VSS line 102, enabling a voltage to be supplied to the substrate terminal to be supplied, for example, from outside of the IC using the pad 164. Now, the operation of the IC in FIG. 1 is described hereinafter.

At the time of a logical function test or a function test, conducted during testing prior to the delivery of products manufactured on a mass production basis, and during practical applications after the testing prior to the delivery, the power source voltage on the high potential side VDD is supplied to the pad 163 in the same way as for the pad 161, and the power source voltage on the low potential side VSS is supplied to the pad 164 in the same way as for the pad 162. This will enable the IC in FIG. 1 to perform logical operation as a common IC using the MT CMOS technology.

More specifically, when in an operating mode, both the PMOS 111 and NMOS 121 are turned into a conducting state by causing a voltage of the control signal SL to be at the same level as that of the power source voltage on the low potential side VSS, whereupon an internal voltage drop occurs due to power source current consumed by the logic gate circuit 105 because both the PMOS 111 and NMOS 121, in an conducting state, have on-resistance internally. For this reason, by designing the PMOS 111 and NMOS 121 to have the respective gates large in width such that the on-resistance thereof is made as small as negligible, it is possible to cause the VDDV line 103 to be at a potential substantially equivalent to that of the VDD line 101, and to cause the VSSV line 104 to be at a potential substantially equivalent to that of the VSS line 102. As a result, the logic gate circuit 105 can be supplied with a voltage equivalent to the power source voltage on the high potential side VDD, and with a voltage equivalent to the power source voltage on the low potential side VSS, via the VDDV line 103 and the VSSV line 104, respectively.

As the power source voltage on the high potential side VDD is supplied to the substrate terminal of the PMOSes 131 to 133, making up the logic gate circuit 105, respectively, and the power source voltage on the low potential side VSS is supplied to the substrate terminal of the NMOSes 141 to 143 of the logic gate circuit 105, respectively, the logic gate circuit 105 is able to perform logic operation.

In this case, as the PMOSes 131 to 133, and the NMOSes 141 to 143, making up the logic gate circuit 105, are made so as to have the respective threshold voltages Vt at low levels, the logic gate circuit 105 can be operated with the power source voltage on the high potential side VDD at a lower level while maintaining the gate propagation delay time tpd equivalent to or better than that in the case where a logic gate circuit is made up of PMOSes and NMOSes, having higher threshold voltages. That is, the operation and the function of the IC in FIG. 1 when in a state described above is as good as those of a conventional IC using the MT CMOS technology.

Then, when in a standby mode, both the PMOS 111 and NMOS 121 are turned into a nonconducting state by causing a voltage of the control signal SL to be at the same level as that of the power source voltage on the high potential side VDD, whereupon supply of the power source voltage on the high potential side VDD and the power source voltage on the low potential side VSS to the logic gate circuit 105 is stopped, and consequently, the subthreshold leak current $I_{leak}$ at that time will be determined depending on the subthreshold current characteristic of the PMOS 111 and the NMOS 121, acting as the switch, in a nonconducting state. As described in the foregoing, since the PMOS 111 and NMOS 121, acting as the switch, have the respective threshold voltages at higher levels, it is possible to control the subthreshold leak current $I_{leak}$ at a small value in spite of the fact that the logic gate circuit 105 is made up of the PMOSes and the NMOSes, having the respective threshold voltages at low levels. That is, the operation and the function of the IC in FIG. 1 when in a state described above is also as good as those of a conventional IC using the MT CMOS technology.

Now, the operation of the IC in FIG. 1 when the IDDQ test is conducted thereon during testing prior to the delivery of products manufactured on a mass production basis is described hereinafter.

When the IDDQ test is conducted, a voltage higher than the power source voltage VDD on the high potential side, for example, VDD+1.0V is applied to the pad 163. This causes VDD+1.0V to be applied to the substrate terminal of the PMOS 111 and the PMOSes 131 to 133, respectively, turning a voltage Vbs between the substrate and the source of the respective PMOSes to 1.0V. At the same time, a voltage lower than the power source voltage VSS on the low potential side, for example, VSS−2.0V is applied to the pad 164. This causes VSS−2.0V to be applied to the substrate terminal of the NMOS 121 and the NMOSes 141 to 143, respectively, turning a voltage Vbs between the substrate and the source of the respective NMOSes to −2.0V.

In this connection, change in the electrical characteristic of a PMOS and an NMOS when a voltage is applied to the substrate thereof as described above is explained about. FIG. 2 shows the general characteristic of the threshold voltage Vt of a submicron class MOS FET, dependent on a voltage Vbs between the substrate and the source thereof. FIG. 2(A) indicates an example in the case of a PMOS, and FIG. 2(B) an example in the case of an NMOS.

As shown in FIG. 2, the threshold voltage Vt of a MOS FET varies normally depending on a voltage Vbs between the substrate and the source thereof. This is the electrical characteristic of the MOS FET, known as the substrate bias effect. As shown in FIG. 2(A), in the case of two PMOSes with the threshold voltage Vt set at −0.5V and −0.2 v, respectively, when Vbs=0V, the threshold voltage Vt is turned to on the order of −0.8V, and −0.5V, respectively, by changing a voltage applied to the substrate, that is, a substrate voltage, to VDD+1.0V, or by changing to the Vbs=1.0V. That is, the threshold voltages increase in negative value.

Similarly, as shown in FIG. 2(B), in the case of two NMOSes with the threshold voltage Vt set at 0.5V and 0.2V, respectively, when Vbs=0V, the threshold voltage Vt is turned to on the order of 0.8V, and 0.5V, respectively, by changing a voltage applied to the substrate, that is, a substrate voltage, to VDD−2.0V, or by changing to the Vbs=−2.0V. That is, the threshold voltages increase in positive value.

Thus, with the logic circuit 105 in FIG. 1, notwithstanding the threshold voltage Vt of the PMOSes 131 to 133, set at −0.2V (provided that Vbs=0V), and the threshold voltage Vt of the NMOSes 141 to 143, set at 0.2V (provided that Vbs=0V), the threshold voltage Vt of respective MOS FETs can be altered by applying the substrate voltage at suitable voltage values from the pad 163 and the pad 164, respectively. In this embodiment, as a voltage at VDD+1.0V is applied to the pad 163, and a voltage at VSS−2.0V is applied to the pad 164, it is possible to set the threshold voltage Vt of the PMOSes 131 to 133, making up the logic circuit 105, at −0.5V, substantially equivalent to a high threshold voltage value, and to set the threshold voltage Vt of the NMOSes 141 to 143 at 0.5V, substantially equivalent to a high threshold voltage value.

Assuming that, for example, a 0.25 micron class IC with 100,000 gates integrated therein is in use, the subthreshold leak current $I_{leak}$ of the IC in whole can be controlled at on the order of 100 nA to 10 µA by setting up as above even in an operating mode where both the PMOS 111 and the NMOS 121 are caused to turn to a conducting state by rendering a voltage of a control signal SL to be at the level of the power source voltage VSS on the low potential side. Accordingly, the IDDQ test can then be applied to the IC.

More specifically, in a condition wherein the threshold voltages of the MOS FETs of the logic gate circuit 105 are kept at higher levels than those in the normal condition by applying voltages from the pads 163, 164, respectively, and in several patterns of stable conditions wherein the output voltage of respective logic gate circuits within the IC is set at a high voltage level or a low voltage level, a current value of power source current IDD is measured. If a current value of the power source current IDD as measured is found sufficiently greater than a preestimated value (for example, in the range of 100 nA to 10 $\mu$A), occurrence of abnormality inside the IC can be determined. By measuring the power source current IDD in this way, occurrence of abnormality can be determined with ease because in case of occurrence of abnormality such as a short between connections within the IC, short current as much as 100 $\mu$A to 10 mA will be superimposed on the power source current IDD.

As described hereinbefore, the IC according to the first embodiment of the invention has a configuration such that the substrate voltage for the respective PMOSes and the respective NMOSes, making up the logic gate circuit 105, can be applied thereto at suitable voltage levels from outside of the IC via the pad 163 and the pad 164, respectively. Accordingly, by applying voltages so as to increase the threshold voltage Vt of the PMOSes and NMOSes of the logic gate circuit, respectively, having the threshold voltage Vt at low levels originally, at the time of the IDDQ test conducted during testing prior to the delivery of products manufactured on a mass production basis, abnormality occurring inside the IC can be detected with ease at the IDDQ test, and a failure detection ratio during the testing prior to the delivery of products manufactured on a mass production basis can be improved.

Further, with this embodiment, since there is no need of adding extensive function tests, it is also possible to reduce appreciably an increase in testing time and test costs. Still further, with this embodiment, all that is needed to gain the beneficial effects described above is nothing but to install the VDDS line 106, the VSSS line 107, and the pads 163, 164, without causing an increase in the chip size of the IC in whole. The VDDS line 106, the VSSS line 107, and the pads 163, 164 can be installed by use of the common semiconductor manufacturing technology, hardly causing complexity or increase in manufacturing steps.

Figure 3:
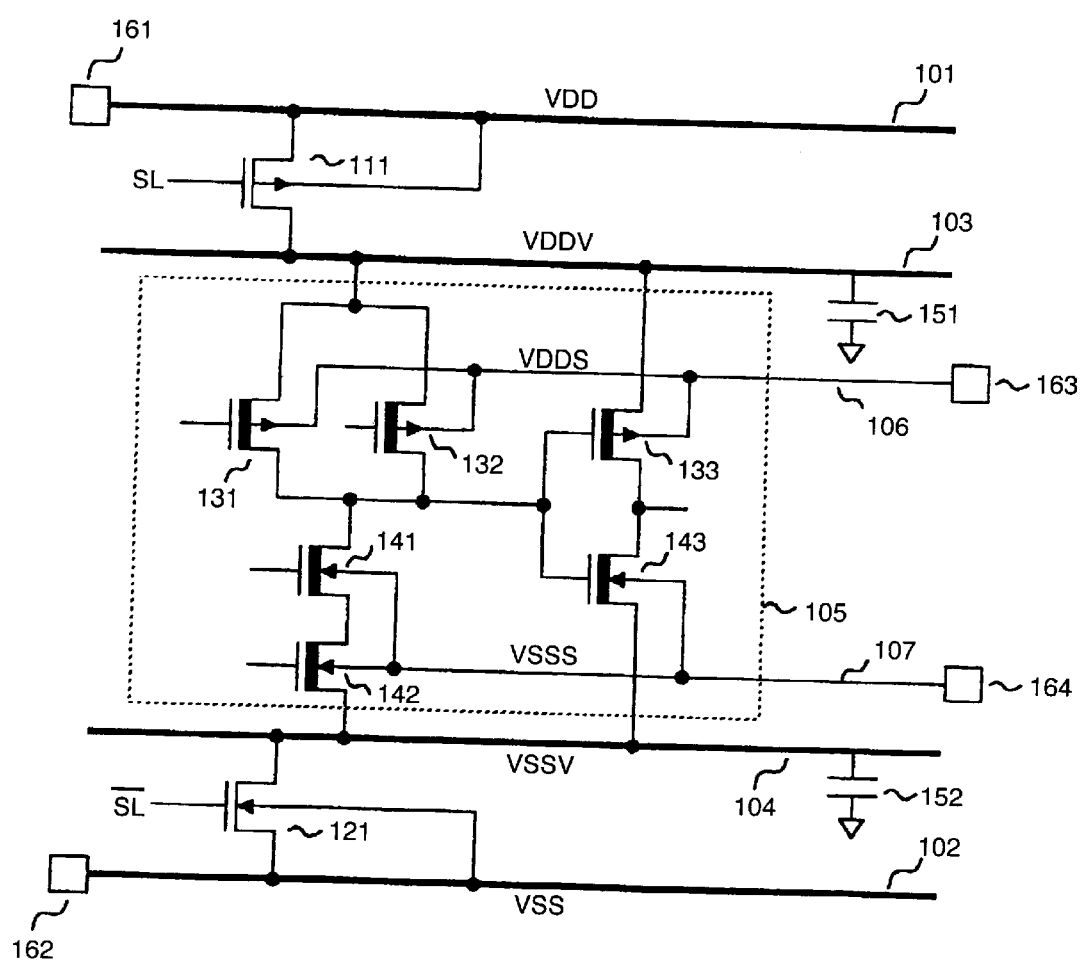
FIG. 3 is a circuit diagram showing the principal part of a semiconductor integrated circuit (IC) according to a second embodiment of the invention.

Next, a second embodiment of the invention is described hereinafter with reference to accompanying drawings. FIG. 3 is a circuit diagram showing the principal part of a IC according to a second embodiment of the invention. In FIG. 3, components corresponding to those previously described with reference to FIG. 1 are denoted by the same reference numerals. As for the configuration shown in FIG. 3, only parts thereof, differing from that in FIG. 1, are described.

Figure 4:
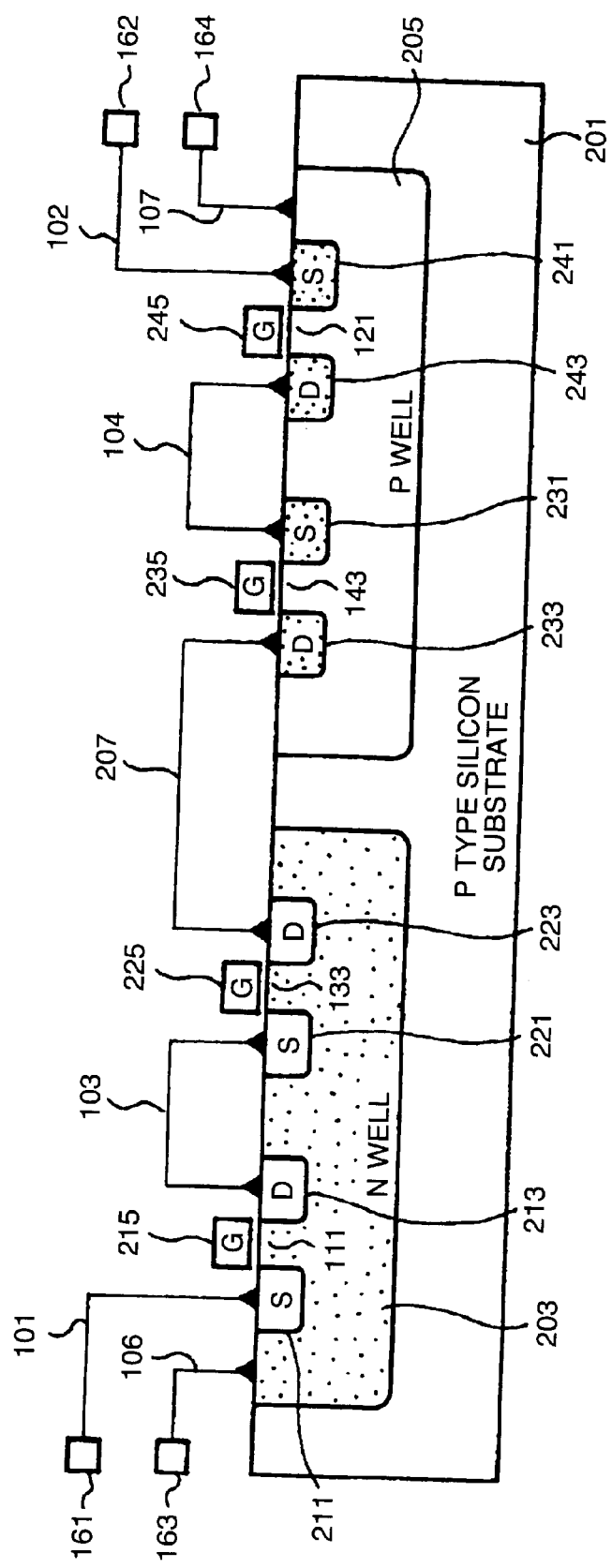
FIG. 4 is a sectional view showing the structure of the principal part of the IC according to the first embodiment.

In FIG. 3, a PMOS 111 acting as a switch on the high potential side has the substrate terminal connected to a VDD line 101 while a NMOS 121 acting as a switch on the low potential side has the substrate terminal connected to a VSS line 102. The operation of the IC shown in FIG. 4 is described hereinafter.

At the time of the logical function test or the function test, conducted during testing prior to the delivery of products manufactured on a mass production basis, and during practical applications after the testing prior to the delivery a power source voltage VDD on the high potential side is supplied to a pad 163 in the same way as for a pad 161, and a power source voltage VSS on the low potential side is supplied to a pad 164 in the same way as for a pad 162. This will cause the power source voltage VDD on the high potential side to be supplied to the substrate terminal of a PMOS 111 and PMOSes 131 to 133, respectively, and cause the power source voltage VSS on the low potential side to be supplied to the substrate terminal of a NMOS 121 and NMOSes 141 to 143, respectively. In this case, the IC in FIG. 3 is able to perform logical operation as a common IC using the MT CMOS technology. Since the operation of the IC in this state is the same as that in FIG. 1, description thereof is omitted.

Now, the operation of the IC in FIG. 3 when the IDDQ test is conducted thereon during testing prior to the delivery of products manufactured on a mass production basis is described hereinafter.

When the IDDQ test is conducted, a voltage higher than the power source voltage VDD on the high potential side, for example, a voltage at VDD+1.0V, is applied to the pad 163. This causes a voltage at VDD+1.0V to be applied to a substrate terminal of the PMOSes 131 to 133 making up a logic gate circuit 105, respectively, thereby turning a voltage Vbs between the substrate and the source of the respective PMOSes 131 to 133, making up the logic gate circuit 105, to 1.0V. Accordingly, the threshold voltage Vt thereof is set at −0.5V.

Then, a voltage lower than the power source voltage VSS on the low potential side, for example, a voltage at VSS−2.0V, is applied to the pad 164. This causes a voltage at VSS−2.0V to be applied to a substrate terminal of the NMOSes 141 to 143, making up the logic gate circuit 105, respectively, thereby turning a voltage Vbs between the substrate and the source of the NMOSes 141 to 143, making up a logic gate circuit 105, respectively, to −2.0V. Accordingly, the threshold voltage Vt thereof is set at 0.5V.

For this reason, the second embodiment of the invention can obtain the same beneficial effect as the first embodiment since the threshold voltage of the respective PMOSes and the respective NMOSes, making up a logic gate circuit 105, can be increased at the time of the IDDQ test as with the case of the first embodiment.

Further, the second embodiment of the invention can obtain the following beneficial effect additionally.

In the first embodiment, at the IDDQ test, the PMOS 111 acting as the switch on the high potential side is supplied with the substrate voltage at VDD+1.0V from a VDDS line 106, and the NMOS 121 acting as the switch on the low potential side is supplied with the substrate voltage at VSS−2.0V from a VSSS line 107. Accordingly, the threshold voltage of the PMOS 111 will be on the order of −0.8V while the threshold voltage of the NMOS 121 will be on the order of 0.8V. This may cause internal on-resistance of the PMOS 111 and the NMOS 121, acting as the switches, to increase when in a conducting state, at the time of the IDDQ test.

A drain current Id of a MOS FET when in a conducting state can be represented by the following expression:

$$Id \ (Vgs-Vt)^2 \qquad (5)$$

where

Vgs=voltage between the gate and the source.

In this connection, Vgs of the PMOS 111 and the NMOS 121, respectively, when in an operating mode, can be expressed as follows:

$$Vgs=VDD$$

Therefore, based on the expression (5), the drain current Id when in an operating mode can be represented as follows:

$$Id \propto (VDD-Vt)^2 \qquad (6)$$

The expression (6) shows that the higher the threshold voltage Vt, the less the drain current Id becomes, in other words, the greater the on-resistance becomes. Consequently, there will arise a possibility of the PMOS 111 and the NMOS 121 becoming short in power source current supplied when setting respective output voltages of the logic gate circuit 105 at the predetermined voltage levels (at a high voltage level or a low voltage level) by causing the logic gate circuit 105 within the IC to be in an operating state at the time of the IDDQ test. This will cause the voltage levels of a VDDV line 103 and a VSSV line 104 to undergo large fluctuation, and it will become difficult to stabilize the operation of the logic gate circuit 105. As a result, it will take longer time to set accurately the voltage level of an output voltage of the logic gate circuit 105. This may be coped with by designing a larger width of the gate for the PMOS 111 and the NMOS 12, respectively, so that current supply capacity is increased, however, in such a case, there will be an increase in the chip area of the IC.

With the IC according to the second embodiment, the substrate terminal of the PMOS 111 is connected to the VDD line 101, and the substrate terminal of the NMOS 121 is connected to the VSS line 102. Accordingly, the substrate voltage of the PMOS 111 and the NMOS 121, respectively, does not undergo fluctuation even at the time of the IDDQ test. Consequently, there will not arise a possibility of the PMOS 111 and the NMOS 12 becoming short in power source current supply capacity, enabling the voltage level of the output voltage of the logic gate circuit 105 to be set accurately with ease.

Now, the structure of the IC according to the first embodiment and the second embodiment, respectively, is described hereinafter. FIG. 4 is a sectional view showing the structure of the principal part of the IC according to the first embodiment, and FIG. 5 is a sectional view showing the structure of the principal part of the IC according to the second embodiment. In FIGS. 4 and 5, the PMOSes 131, 132 and the NMOSes 141, 142, disposed inside the logic gate circuit 105, are omitted to avoid complexity of the figures. In FIG. 4, components corresponding to those in FIG. 1 are denoted by the same reference numerals as those used in FIG. 1, and in FIG. 5, components corresponding to those in FIG. 3 are denoted by the same reference numerals as those used in FIG. 3.

In FIG. 4, a N well layer 203 and a P well layer 205 are formed in a P type silicon substrate 201. Within the N well layer 203, the source electrode 211 and the drain electrode 213 of the PMOS 111, and the source electrode 221 and the drain electrode 223 of the PMOS 133 are formed, respectively. The gate electrode 215 is formed on top of the N well layer 203 with a gate oxide film interposed therebetween, and in the region between the source electrode 211 and the drain electrode 213 of the PMOS 111 while the gate electrode 225 is formed on top of the N well layer 203 with a gate oxide film interposed therebetween, and in the region between the source electrode 221 and the drain electrode 223 of the PMOS 133.

Within the P well layer 205, the source electrode 241 and the drain electrode 243 of the NMOS 121,and the source electrode 231 and the drain electrode 233 of the NMOS 143 are formed, respectively. The gate electrode 245 is formed on top of the P well layer 205 with a gate oxide film interposed therebetween, and in the region between the source electrode 241 and the drain electrode 243 of the NMOS 121 while the gate electrode 235 is formed on top of the P well layer 205 with a gate oxide film interposed therebetween, and in the region between the source electrode 231 and the drain electrode 233 of the NMOS 143.

The N well layer 203 is connected to the pad 163 via the VDDS line 106. The source electrode 211 of the PMOS 111 is connected to the pad 161 via the VDD line 101. The drain electrode 213 of the PMOS 111 is connected to the source electrode 221 of the PMOS 133 via the VDDV line 103. The drain electrode 223 of the PMOS 133 is connected to the drain electrode 233 of the NMOS 143 via a connection 207.

The P well layer 205 is connected to the pad 164 via the VSSV line 107. The source electrode 241 of the NMOS 121 is connected to the pad 162 via the VSS line 102. The drain electrode 243 of the NMOS 121 is connected to the source electrode 231 of the NMOS 143 via the VSSV line 104.

In FIG. 4, the N well layer 203 and the P well layer 205 correspond to the substrate terminal of the PMOSes and the NMOSes, respectively. That is, the substrate terminal of the respective PMOSes is connected to the VDDS line 106, and the substrate terminal of the respective NMOSes is connected to the VSSS line 107. Thus, in the IC according to the first embodiment of the invention, shown in FIG. 1, respective MOS FETs can be fabricated by diffusing one N well layer and one P well layer, respectively, in a substrate, which can be attained by use of the process technology for CMOS of a double-well structure.

In FIG. 4, a case of using a P type silicon substrate is described, however, similar description is applicable to a case of using a N type silicon substrate as well. In such a case, a N type silicon substrate is substituted for the P type silicon substrate 201, and other components may be considered to be the same.

FIG. 5 (A) is a view showing the structure of the IC according to the second embodiment, made up by using a P type silicon substrate. In FIG. 5 (A), three N well layers 302, 303, 304, and a P well layer 306 are formed in a P type silicon substrate 301. Within the N well layer 302, the source electrode 211 and the drain electrode 213 of the PMOS 111 is formed, and within the N well layer 303, the source electrode 221 and the drain electrode 223 of the PMOS 133 are formed. The gate electrode 215 is formed on top of the N well layer 302 with a gate oxide film interposed therebetween, and in the region between the source electrode 211 and the drain electrode 213 of the PMOS 111, and the gate electrode 225 is formed on top of the N well layer 303 with a gate oxide film interposed therebetween, and in the region between the source electrode 221 and the drain electrode 223 of the PMOS 133.

Within the N well layer 304, a P well layer 305 is formed. Within the P well layer 305, the source electrode 231 and the drain electrode 233 of the NMOS 143 are formed. The gate electrode 235 is formed on top of the P well layer 305 with a gate oxide film interposed therebetween, and in the region between the source electrode 231 and the drain electrode 233 of the NMOS 143. Within the P well layer 306, the source electrode 241 and the drain electrode 243 of the NMOS 121 are formed, respectively. The gate electrode 245 is formed on top of the P well layer 306 with a gate oxide film interposed therebetween, and in the region between the source electrode 241 and the drain electrode 243 of the NMOS 121.

The N well layer 302 and the source electrode 211 of the PMOS 111 are connected to the pad 161 via the VDD line 101. The N well layer 303 is connected to the pad 163 via the VDDS line 106. The drain electrode 213 of the PMOS 111 is connected to the source electrode 221 of the PMOS 133 via the VDDV line 103. The drain electrode 223 of the PMOS 133 is connected to the drain electrode 233 of the NMOS 143 via a connection 207. The P well layer 305 is connected to the pad 164 via the VSSS line 107. The source electrode 241 of the NMOS 143 is connected to the drain electrode 243 of the NMOS 121 via the VSSV line 104. The P well layer 306 and the source electrode 241 of the NMOS 121 are connected to the pad 162 via the VSS line 102.

In FIG. 5 (A), the N well layer 304 is provided in order to prevent resistive electrical connection from being made between the P well layer 305 and the P well layer 306 through the P type silicon substrate. Accordingly, the N well layer 304 is formed so as to surround the P well layer 305. By supplying a power source voltage on the high potential side such as the power source voltage VDD to the N well layer 304, the P well layer 305 can be electrically isolated from the P well layer 306.

The N well layers 302, 303, and the P well layers 305, 306 correspond to the substrate terminal of the respective PMOSes and the respective NMOSes, made up in the respective well layers.

Accordingly, the IC according to the second embodiment can have a configuration such that a voltage different from that applied to the substrate terminal of the respective MOS FETs of the logic gate circuit 105 is applied to the substrate terminal of the PMOS 111 and the NMOS 121, acting as the switch, respectively. It follows that the IC according to the second embodiment can be attained by adopting a well structure as illustrated in FIG. 5 (A). Such a well structure as described is called a triple-well structure, and the IC according to the second embodiment can be fabricated by use of the process technology for the CMOS of the triple-well structure.

FIG. 5 (B) is a view showing the structure of the IC according to the second embodiment, made up by using a N type silicon substrate. In FIG. 5 (B), three P well layers 404, 404, 406, and a N well layer 402 are formed in a N type silicon substrate 401. Within the N well layer 402, the source electrode 211 and the drain electrode 213 of the PMOS 111 is formed, and within the P well layer 404, a N well layer 403 is formed. Within the N well layer 403, the source electrode 221 and the drain electrode 223 of the PMOS 133 are formed. The gate electrode 215 is formed on top of the N well layer 402 with a gate oxide film interposed therebetween, and in the region between the source electrode 211 and the drain electrode 213 of the PMOS 111, and the gate electrode 225 is formed on top of the N well layer 403 with a gate oxide film interposed therebetween, and in the region between the source electrode 221 and the drain electrode 223 of the PMOS 133.

Within the P well layer 405, the source electrode 231 and the drain electrode 233 of the NMOS 143 are formed. The gate electrode 235 is formed on top of the P well layer 405 with a gate oxide film interposed therebetween, and in the region between the source electrode 231 and the drain electrode 233 of the NMOS 143.

Further, within the P well layer 406, the source electrode 241 and the drain electrode 243 of the NMOS 121 are formed, respectively. The gate electrode 245 is formed on top of the P well layer 406 with a gate oxide film interposed therebetween, and in the region between the source electrode 241 and the drain electrode 243 of the NMOS 121.

The N well layer 402, and the source electrode 211 of the PMOS 111 are connected to the pad 161 via the VDD line 101. The N well layer 403 is connected to the pad 163 via the VDDS line 106. The drain electrode 213 of the PMOS 111 is connected to the source electrode 221 of the PMOS 133 via the VDDV line 103. The drain electrode 223 of the PMOS 133 is connected to the drain electrode 233 of the NMOS 143 via the connection 207. The P well layer 405 is connected to the pad 164 via the VSSS line 107. The source electrode 231 of the NMOS 143 is connected to the drain electrode 243 of the NMOS 121 via the VSSV line 104. The P well layer 406 and the source electrode 241 of the NMOS 121 are connected to the pad 162 via the VSS line 102.

In FIG. 5 (B), the P well layer 404 is provided in order to prevent resistive electrical connection from being made between the N well layer 402 and the N well layer 403 through the N type silicon substrate 401. Accordingly, the P well layer 404 is formed so as to surround the N well layer 403. By supplying a power source voltage on the low potential side such as the power source voltage VSS, and the like to the P well layer 404, the N well layer 402 can be electrically isolated from the N well layer 403.

The N well layers 402, 403, and the P well layers 405, 406 correspond to the substrate terminal of the respective PMOSes and the respective NMOSes, made up in the respective well layers.

Accordingly, the IC according to the second embodiment can have a configuration such that a voltage different from that applied to the substrate terminal of the respective MOS FETs of the logic gate circuit 105 is applied to the substrate terminal of the PMOS 111 and the NMOS 121, acting as the switch, respectively. It follows that the IC according to the second embodiment can be attained by adopting a well structure as illustrated in FIG. 5 (B) even when a N type silicon substrate is used.

Figure 6:
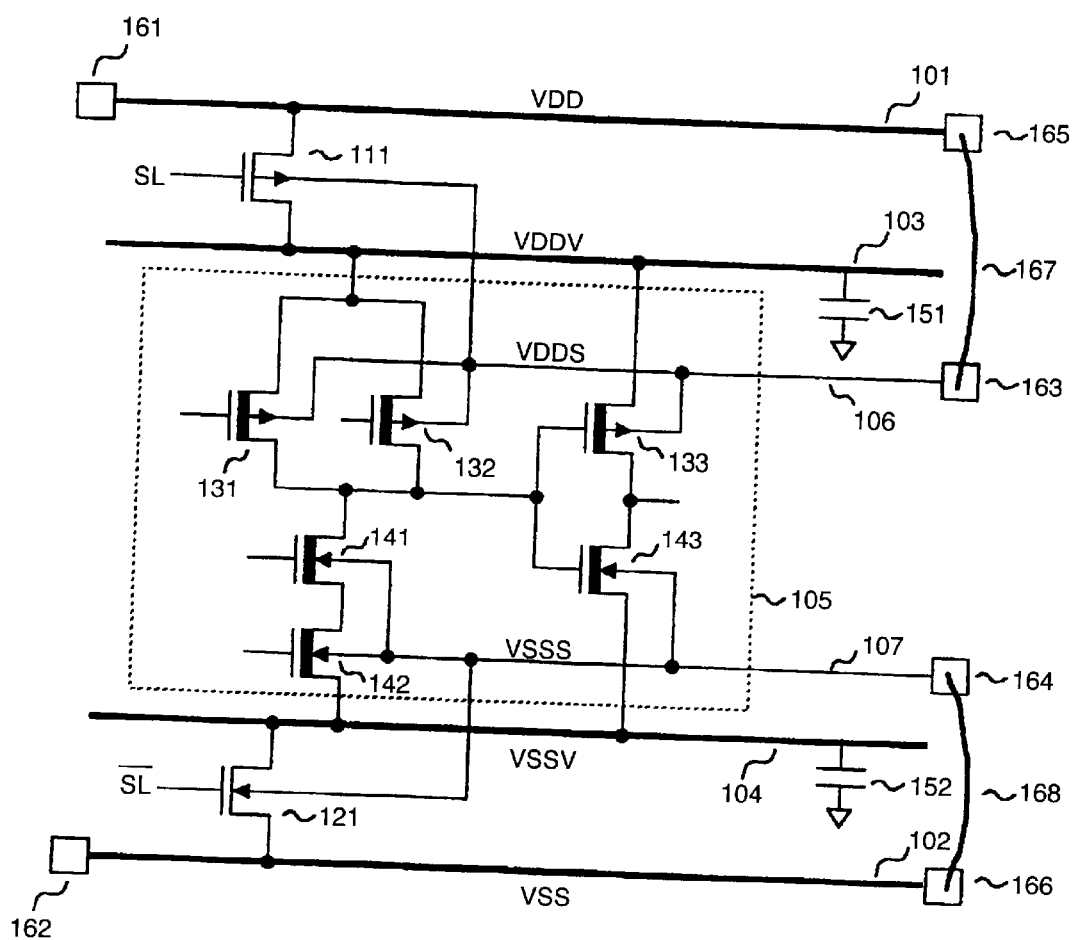
FIG. 6 is a sectional view showing the structure of the principal part of the IC according to the third embodiment.

Next, an IC according to the third embodiment of the invention is described hereinafter with reference to the accompanying drawings. FIG. 6 is a circuit diagram showing the structure of the principal part of the IC according to the third embodiment. In FIG. 6, components corresponding to those in FIG. 1 are denoted by the same reference numerals as those used in FIG. 1. As for the configuration shown in FIG. 6, only parts differing from those in FIG. 1 will be described.

In FIG. 6, with the IC as shown in FIG. 1, the VDD line 101 is provided with a pad 165 for connection of the VDDS line 106 with the VDD line 101 so that the VDDS line 106 can be connected to the VDD line 101 in a later processing step. Also, the VSS line 102 is provided with a pad 166 for connection of the VSSS line 107 with the VSS line 102 so that the VSSS line 107 can be connected to the VSS line 102 in the later processing step. The later processing step mentioned above refers to a fabrication process (commonly called an assembling process) for scribing, wire bonding, and packaging chips which have been determined to be conforming products by a probing test and so forth, to be performed after the completion of a manufacturing process (commonly called a wafer process) for forming devices on top of a silicon substrate. FIG. 6 shows the condition of the IC wherein the pad 163 is connected to the pad 165 by wire bonding with a wire 167, and the pad 164 is connected to the pad 166 by wire bonding with a wire 168.

Before connecting the pads 163, 164 to the pads 165, 166 with the wires 167, 168, respectively, the IC is in the same condition as the IC according to the first embodiment. Accordingly, the IC according to the third embodiment is expected to have the same operation and the effect as those for the first embodiment. That is, the IDDQ test and the like can be applied thereto as with the case of the first embodiment.

In the later processing step after testing prior to the delivery of products manufactured on a mass production basis such as the IDDQ test and the like, the pads 163, 164 are connected to the pads 165, 166 by wire bonding with the wires 167, 168, respectively. As a result, the IC requires, as the external terminal thereof, only one external terminal for receiving the power source voltage VDD due to the connection between the pad 163 and the pad 165, and only one external terminal for receiving the ground voltage VSS due to the connection between the pad 164 and the pad 166. This means that there will be no need of the IC being provided with additional external terminals as a result of addition of the pads 163, 164, enabling the number of the external terminals of the IC to remain the same as that for conventional ICs, to which the present invention is not applied.

Consequently, with the IC according to the third embodiment, since an increase in the number of the IC terminals can be prevented, handiness in use of the IC products will not be impaired, and an increase in the cost of package materials will not result while the same beneficial effect as that for the first embodiment can be obtained. It is also possible to make the characteristics of the third embodiment applicable to the IC according to the second embodiment.

Figure 7:
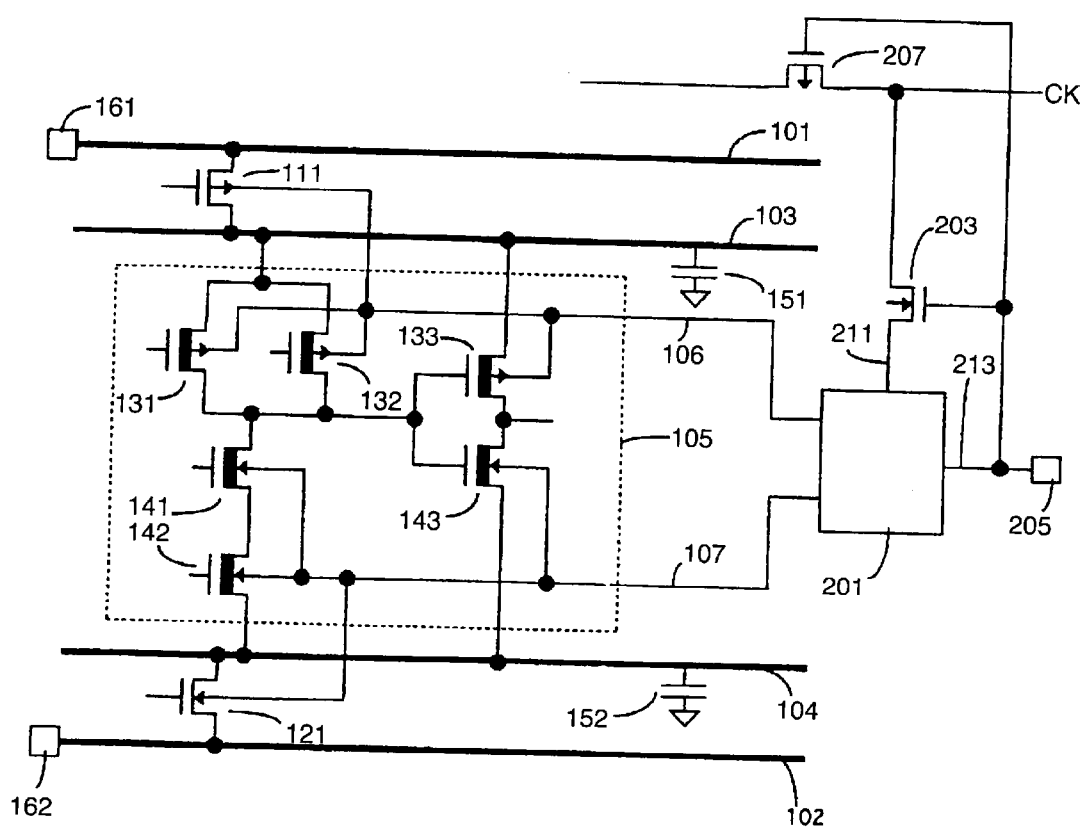
FIG. 7 is a sectional view showing the structure of the principal part of the IC according to the fourth embodiment.

Next, an IC according to the fourth embodiment of the invention is described hereinafter with reference to the accompanying drawings. FIG. 7 is a circuit diagram showing the structure of the principal part of the IC according to the fourth embodiment. In FIG. 7, components corresponding to those in FIG. 1 are denoted by the same reference numerals as those used in FIG. 1. As for the configuration shown in FIG. 7, only parts differing from those in FIG. 1 will be described.

In FIG. 7, the IC as shown in FIG. 1 is provided with a voltage generation circuit 201 for generating a substrate voltage of respective MOS FETs, making up a logic gate circuit 105, in place of the pads 163, 164. As a result of the installation of the voltage generation circuit 201, the IC in FIG. 7 is provided with a pad 205, a NMOS 203, and a PMOS 207 as well. Other components shown in FIG. 7 are the same as those in FIG. 1.

A signal inputted to the pad 205, for example, a test signal for directing tests such as the IDDQ test is delivered to the voltage generation circuit 201 via a connection 213. Also, a clock signal CK is delivered to the voltage generation circuit 201 via the NMOS 203 when same is in a conducting state. The gate electrode of the NMOS 203 is connected to the pad 205. The PMOS 207 is for transmitting the clock signal CK to the interior of the IC, for example, to the logic gate circuit 105 when the PMOS 207 is in a conducting state. The gate electrode of the PMOS 207 is connected to the pad 205.

That is, when a test signal having a voltage at the level of the power source voltage VDD on the high potential side is delivered from the pad 205, the PMOS 207 is turned to a nonconducting state while the NMOS 203 is turned to a conducting state. Consequently, the clock signal CK can not be transmitted to the logic gate circuit 105, so that the output voltage of the logic gate circuit 105 can be held at a fixed level. As the clock signal CK is supplied to the voltage generation circuit 201, a substrate voltage that will increase the threshold voltage of respective MOS FETs, making up the logic gate circuit 105, is generated, and transmitted to a VDDS line 106 and a VSSS line 107. Accordingly, as with the case of the first embodiment of the invention, the IDDQ test can be conducted on the IC.

Then, when a test signal having a voltage at the level of the power source voltage VSS on the low potential side is delivered from the pad 205, the PMOS 207 is turned to a conducting state while the NMOS 203 is turned to a nonconducting state. As a result, the clock signal CK can be transmitted to the logic gate circuit 105. Since the clock signal CK is not supplied to the voltage generation circuit 201, a substrate voltage that will keep the threshold voltage of the respective MOS FETs, making up the logic gate circuit 105, at low levels, is generated, and transmitted to a VDDS line 106 and the VSSS line 107. Consequently, the logic gate circuit 105 is enabled to perform logic operation, so that normal operation of the IC in whole can be executed.

Figure 8:
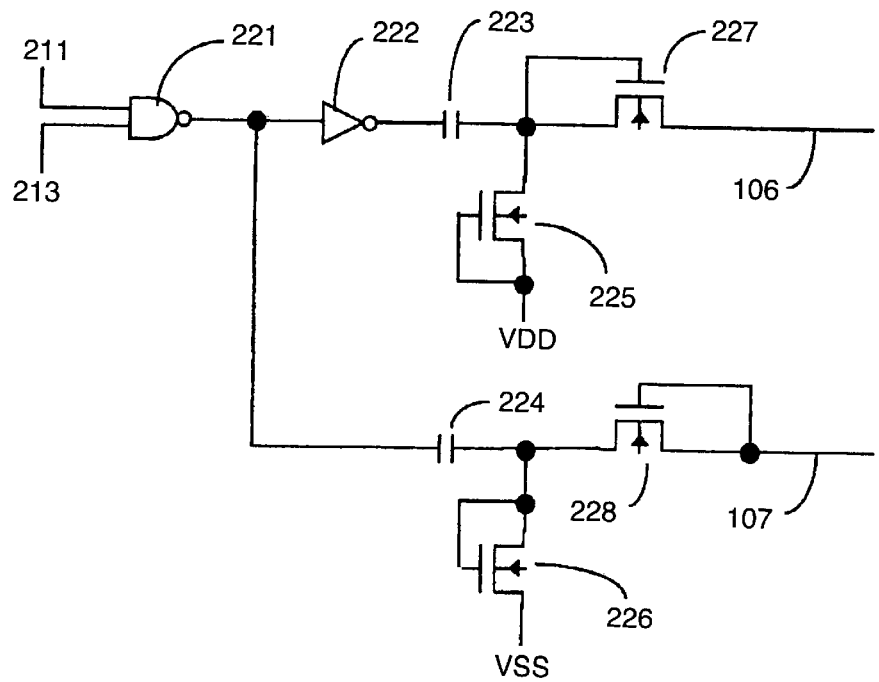
FIG. 8 is a circuit diagram of a voltage generation circuit shown in FIG. 7.

Now, the configuration of the voltage generation circuit 201 is described hereinafter with reference to the accompanying drawings. FIG. 8 is a circuit diagram of the voltage generation circuit 201.

As shown in FIG. 8, the voltage generation circuit 201 comprises a two-input/one-output NAND gate 221, an inverter 222, capacitors 223, 224, and NMOSes 225 to 228. The clock signal CK via a connection 211, and a signal (for example, test signal) inputted from the pad 205 via the connection 213 are delivered to the two input terminals of the NAND gate 221, respectively. The output terminal of the NAND gate 221 is connected to the input terminal of the inverter 222. The output terminal of the inverter 222 is coupled with one of the electrodes of the capacitors 223, and 224, respectively. Each of the NMOSes 225 to 228 making up the voltage generation circuit 201 is to have a high threshold voltage as with the case of a NMOS 121, and a substrate terminal of the respective NMOSes 225 to 228 is to be connected to a VSS line 102.

The other electrode of the capacitor 223 is connected to one of the electrodes of the NMOSes 225 and 227, respectively. The power source voltage VDD on the high potential side is supplied to the gate electrode and the other electrode of the NMOS 225. The gate electrode of the NMOS 227 is coupled to the other electrode of the capacitor 223. The other electrode of the NMOS 227 is connected to the VDDS line 106.

The other electrode of the capacitor 224 is coupled to one of the electrodes of the NMOSes 226 and 228, respectively. The gate electrode of the NMOS 226 is coupled to the other electrode of the capacitor 224. The power source voltage VSS on the low potential side is supplied to the other electrode of the NMOS 226. The gate electrode and the other electrode of the NMOS 228 are connected to the VSSS line 107.

With the voltage generation circuit 201 connected as described in the foregoing, when a test signal having a voltage at the level of the power source voltage VSS on the low potential side is inputted from the pad 205, the voltage level of an output signal of the NAND gate 221 is fixed at the level of the power source voltage VDD on the high potential side. This causes the power source voltage VDD on the high potential side to be supplied to the VDDS line 106 via the NMOSes 225 and 227, in a conducting state, and the power source voltage VSS on the low potential side to be supplied to the VSSS line 107 via the NMOSes 226 and 228, in a conducting state. Consequently, as described in the foregoing, the threshold voltage of the respective MOS FETs of the logic gate circuit 105 is kept at low levels, and the logic gate circuit 105 is enabled to perform logic operation, so that normal operation of the IC in whole can be executed.

When a test signal having a voltage at the level of the power source voltage VDD on the high potential side is delivered from the pad 205, the voltage level of an output signal of the NAND gate 221 will correspond to the voltage level of the clock signal CK transmitted via the connection 211. The output signal of the NAND gate 221 will have the waveform thereof rectified by the inverter 222 before transmitted to one of the electrodes of the capacitors 223 and 224, respectively. The capacitors 223 and 224 then carry out charging and discharging repeatedly according to an output signal of the inverter 222. Based on the operation of the capacitors 223 and 224, a voltage higher than the power source voltage VDD on the high potential side, supplied via the NMOSes 225 and 227, in a conducting state, for example, VDD+1.0V, is supplied to the VDDS line 106, and a voltage lower than the power source voltage VSS on the low potential side, supplied via the NMOSes 226 and 228, in a conducting state, for example, VSS−2.0V, is supplied to the VSSS line 107. This causes the threshold voltage of the respective MOS FETs of the logic gate circuit 105 to be increased, enabling the IDDQ test to be performed.

Thus, with the IC according to the fourth embodiment of the invention, not only the beneficial effect of the first embodiment is obtained, but also the substrate voltage of the respective MOS FETs, making up the logic gate circuit 105, can be altered by inputting from the pad 205 a signal having a voltage at the level of either the power source voltage VDD on the high potential side, or the power source voltage VSS on the low potential side. Consequently, there is no need of inputting from outside of the IC a substrate voltage so as to increase the threshold voltage of the respective MOS FETs, making up the logic gate circuit 105, nor any need of installing a circuit for generating such a substrate voltage as described above outside of the IC.

Further, in the case of sealing the IC in FIG. 7 in with plastics, if an external lead corresponding to and connected to the pad 205 to enable a test signal to be inputted to the pad 205 is provided, this will enable the IDDQ test to be conducted as necessary even after the packaging of the IC is completed, enhancing ease of use. In addition, with the IC having a circuit capable of generating a test signal as described above, no increase in the number of external terminals can be expected by arranging the configuration of the circuit such that a test signal outputted from the circuit for generating the test signal is delivered to the pad 205.

Further, if the VSS line 102 is provided with something like the pad 166 shown in FIG. 6, it is possible to cause the IC to be operable only as a common IC without increasing the number of external terminals by connecting the pad 166 with the pad 205 through wire bonding when sealing the IC shown in FIG. 7 in with plastics. The NMOS 203 may be dispensed with, however, the IC of this embodiment is provided with the NMOS 203 so that more reliable operation of the voltage generation circuit 201 can be ensured by not supplying the clock signal CK to the NAND gate 221 of the voltage generation circuit 201. Furthermore, it is also possible to apply the characteristics of the fourth embodiment to the IC according to the second embodiment.

In the first, second, third and fourth embodiments described hereinbefore, description has been made of a case where the present invention is applied to the IC using the MT CMOS technology, comprising the PMOS 111 having a high threshold voltage, disposed between the VDD line 101 and the VDDV line 103, the NMOS 121 having a high threshold voltage, disposed between the VSS line 102 and the VSSV line 104, and the logic gate circuit 105, made up of MOS FETs having low threshold voltages. However, with the MT MOS technology, a configuration omitting the PMOS 111 or the NMOS 121 will pose no problem.

Figure 9:
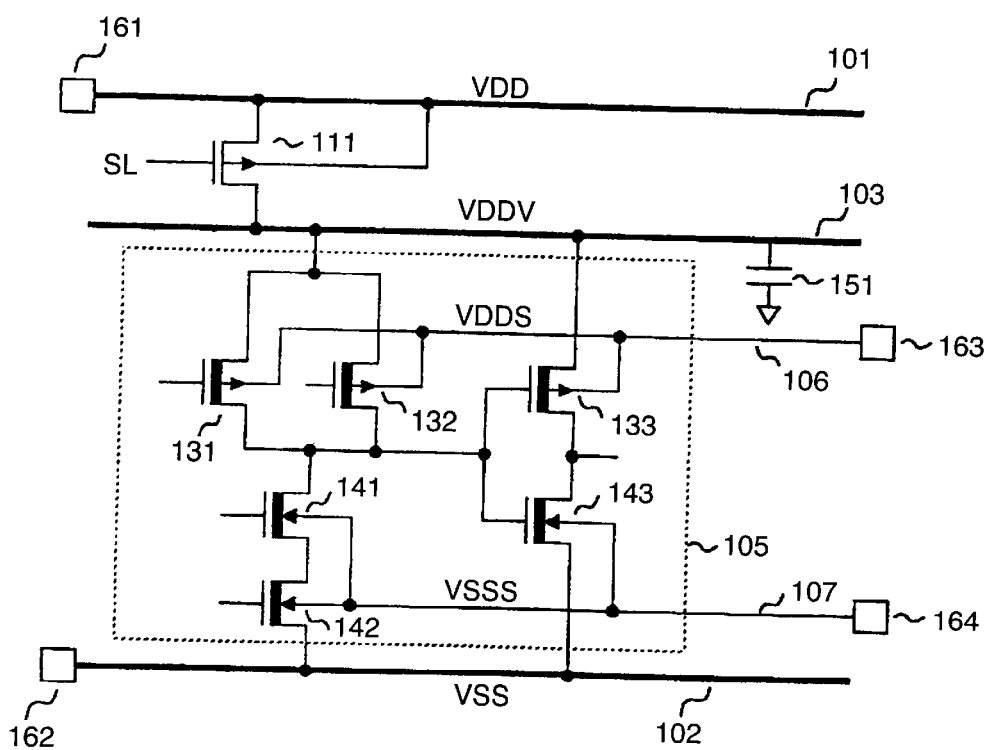
FIG. 9 shows a variation of the circuit diagram for the IC according to the second embodiment.
Figure 10:
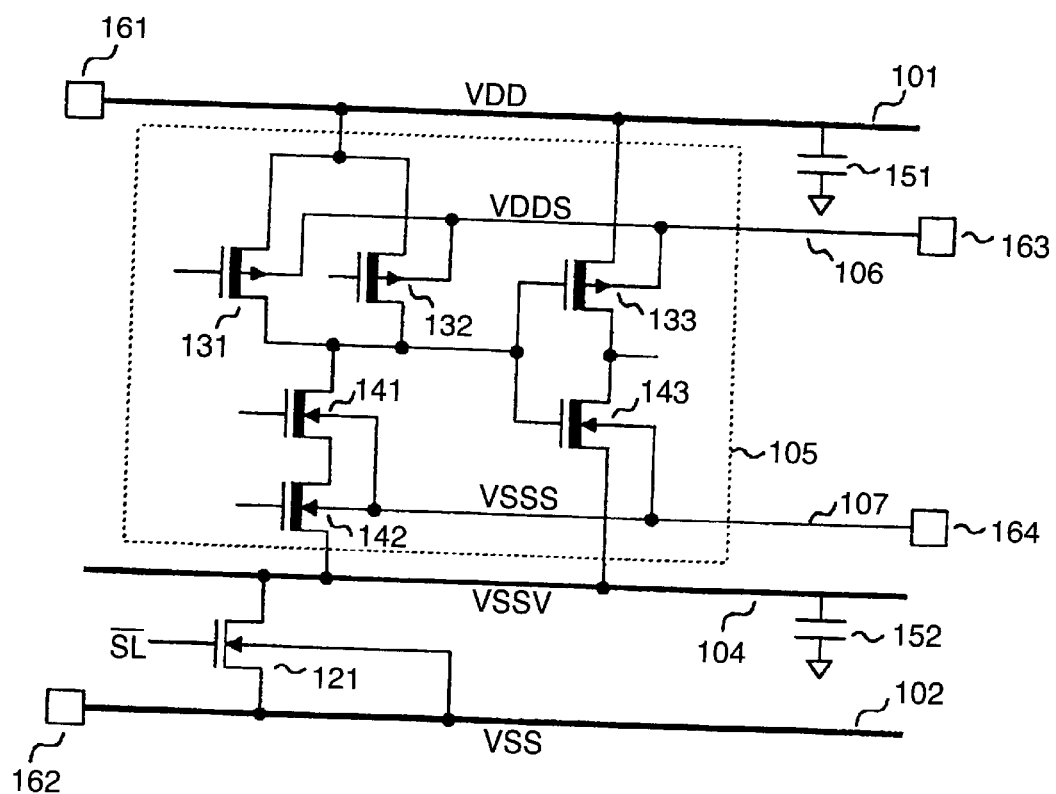
FIG. 10 shows another variation of the circuit diagram for the IC according to the second embodiment.

FIGS. 9 and 10 show a variation of the IC according to the second embodiment by way of example, respectively. The IC shown in FIG. 9 is similar to the IC according to the second embodiment, shown in FIG. 3, except that the NMOS 121 and the VSSV line 104 are dispensed with. Also, the VSS line 102 in place of the VSSV line 104 is directly connected to the logic gate circuit 105. With the MT MOS technology, the subthreshold leak current when the IC is in a standby mode can be reduced to a small value by installing at least one or more MOS FETs having a high threshold voltage, acting as a power source switch, corresponding to the PMOS 111 or the NMOS 121, between the VDD line 101 and the VSS line 102. Accordingly, it can be understood that satisfactory operation can be performed with the configuration shown in FIG. 9. Therefore, the same beneficial effect as that for the second embodiment of the invention can be expected of the IC having the configuration shown in FIG. 9.

Similarly, the IC shown in FIG. 10 is similar to the IC according to the second embodiment, shown in FIG. 3, except that the PMOS 111 and the VDDV line 103 are dispensed with. Also, the VDD line 101 in place of the VDDV line 103 is directly connected to the logic gate circuit 105. The same beneficial effect as that for the second embodiment of the invention can be expected of the IC having the configuration shown in FIG. 10 as well.

As described with reference to FIGS. 9 and 10, the configuration wherein the PMOS 111 or the NMOS 121 is dispensed with can be applied to not only to the IC of the second embodiment but also to the IC of any of the first, third, and fourth embodiments in combination therewith.

Various embodiments of the invention have been described in some detail in the foregoing, however, it is to be understood that the scope of the invention is not limited to the configurations described above.

For example, the circuit configuration of the logic gate circuit 105 is not limited to those described as above with reference to the respective embodiments of the invention. That is, the logic gate circuit 105 may comprise not only MOS FETs having a low threshold voltage but also MOS FETs having a high threshold voltage. The reason for this is because there can be a case where the logic gate circuit 105 is made up of MOS FETs including ones having a high threshold voltage in the case of the circuit not requiring high speed processing by shortening the gate propagation delay time particularly. Even with an IC having the logic gate circuit 105 as described above, the same beneficial effect as that of the present invention can be obtained by similarly applying the configuration of the present invention such that the threshold voltage of MOS FETs having a low threshold voltage can be increased.

While the invention has been described in its preferred embodiments, it is to be understood that various changes and modifications may be made therein without departing from the spirit and scope of the invention.

What is claimed is:

1. A semiconductor integrated circuit having a plurality of first conduction type MOS transistors and a plurality of second conduction type MOS transistors, said semiconductor integrated circuit comprising:

a first power supply line for supplying a first power source voltage;

a first MOS transistor included among the plurality of the first conduction type MOS transistors, having a gate electrode, a first electrode, and a second electrode, the first MOS transistor having a first threshold voltage and the first electrode being electrically connected to the first power supply line;

a first pseudo power supply line electrically connected to the second electrode of the first MOS transistor;

an internal logic circuit having at least a second MOS transistor included among the plurality of the first conduction type MOS transistors, having a substrate terminal, the internal logic circuit supplied with the first power source voltage via the first pseudo power supply line and the second MOS transistor having a second threshold voltage lower than the first threshold voltage, the second threshold voltage controlled according to a voltage inputted to the substrate terminal; and a first terminal electrically connected to the substrate terminal of the second MOS transistor, wherein the substrate terminal of the second MOS transistor is capable of supplying a voltage which changes the second threshold voltage of the second MOS transistor to a higher voltage when the first MOS transistor is in a conductive state.

2. A semiconductor integrated circuit according to claim 1, wherein the first power source voltage is applied to a substrate terminal of the first MOS transistor.

3. A semiconductor integrated circuit according to claim 2, wherein the first MOS transistor is formed in a first well layer of the second conduction type, formed in a semiconductor substrate while the second MOS transistor is formed in a third well layer of the second conduction type, within a second well layer of the first conduction type, formed in the second conduction type semiconductor substrate, the first terminal being connected to the third well layer.

4. A semiconductor integrated circuit according to claim 1, wherein the first terminal is electrically connected to a substrate terminal of the first MOS transistor.

5. A semiconductor integrated circuit according to claim 4, wherein the first and second MOS transistors are formed in a first well layer of the second conduction type, formed in a semiconductor substrate, the first terminal being connected to the first well.

6. A semiconductor integrated circuit according to claim 1, the semiconductor integrated circuit further comprising:

a second power supply line for supplying a second power source voltage which is different from the first power source voltage;

a third MOS transistor included among the plurality of the second conduction type MOS transistors, the third MOS transistor having a gate electrode, a first electrode, and a second electrode, the first electrode being electrically connected to the second power supply line, the third MOS transistor having a third threshold voltage; and a second pseudo power supply line electrically connected to the second electrode of the third MOS transistor, the second pseudo power line supplying the second power source voltage to the internal logic circuit;

wherein said internal logic circuit having at least a fourth MOS transistor of the plurality included among the second conduction type MOS transistors, the fourth MOS transistor having a substrate terminal and having a fourth threshold voltage lower than the third threshold voltage, and said semiconductor integrated circuit still further comprising a second terminal electrically connected to the substrate terminal of the fourth MOS transistor, wherein the substrate terminal of the fourth MOS transistor is capable of supplying a voltage which changes the fourth threshold voltage of the fourth MOS transistor to a higher voltage when the third MOS transistor is in a conductive state.

7. A semiconductor integrated circuit according to claim 6, wherein the second power source voltage is applied to a substrate terminal of the third MOS transistor.

8. A semiconductor integrated circuit according to claim 6, wherein the second terminal is electrically connected to a substrate terminal of the third MOS transistor.

9. A semiconductor integrated circuit according to claim 6, further the semiconductor integrated circuit comprising a fourth terminal connected to the second power supply line, said fourth terminal being electrically connected to the second terminal in state of a molding the semiconductor integrated circuit.

10. A semiconductor integrated circuit according to claim 9, the second terminal electrically connected to the fourth terminal by a wire bonding.

11. A semiconductor integrated circuit according to claim 10, the first terminal electrically connected to the third terminal by a wire bonding.

12. A method of testing a semiconductor integrated circuit, using the semiconductor integrated circuit as set forth in claim 6, wherein the first and third MOS transistors are turned into a conducting state by supplying the first power supply line with the first power source voltage and supplying the second power supply line with the second power source voltage, respectively, and a voltage so as to increase a threshold voltage of the second MOS transistor is supplied to the substrate terminal of the second MOS transistor by use of the first terminal while a voltage so as to increase a threshold voltage of the fourth MOS transistor is supplied to the substrate terminal of the fourth MOS transistor by use of the second terminal before measuring a value of current flowing through the internal logic circuit.

13. A semiconductor integrated circuit according to claim 6, said semiconductor integrated circuit having a third terminal electrically connected to the first power supply line and a fourth terminal electrically connected to the second power supply line, and the first terminal electrically connected to the third terminal and the second terminal electrically connected to the fourth terminal in a state of a molding the semiconductor integrated circuit.

14. A semiconductor integrated circuit according to claim 1, further the semiconductor integrated circuit comprising a third terminal electrically connected to the first power supply line, said third terminal being electrically connected to the first terminal in state of a molding the semiconductor integrated circuit.

15. A semiconductor integrated circuit according to claim 14, the first terminal electrically connected to the third terminal by a wire bonding.

16. A method of testing a semiconductor integrated circuit, using the semiconductor integrated circuit as set forth in claim 1, wherein the first MOS transistor is turned into a conducting state by supplying the first power supply line with the first power source voltage, and a voltage so as to increase a threshold voltage of the second MOS transistor is supplied to the substrate terminal of the second MOS transistor by use of the first terminal before measuring a value of current flowing through the internal logic circuit.

17. A semiconductor integrated circuit having a plurality of first conduction type MOS transistors and a plurality of second conduction type MOS transistors, said semiconductor integrated circuit comprising:

a first power supply line for supplying a first power source voltage;

a first MOS transistor included among the plurality of the first conduction type MOS transistors, having a gate electrode, a first electrode and a second electrode, the first MOS transistor having a first threshold voltage and the first electrode being electrically connected to the first power supply line;

a first pseudo power supply line electrically connected to the second electrode of the first MOS transistor;

an internal logic circuit having at least a second MOS transistor included among the plurality of the first conduction type MOS transistors, having a substrate terminal, the internal logic circuit supplied with the first power source voltage via the first pseudo power supply line and inputted a clock signal, and the second MOS transistor having a second threshold voltage lower than the first threshold voltage;

a test terminal receivable a test signal; and a voltage supplying circuit supplying a predetermined voltage to the substrate terminal of the second MOS transistor according to a predetermined logic level of the test signal received at the test terminal, wherein the logic circuit is inhibited from inputting the clock signal according to the predetermined logic level of the test signal.

18. A semiconductor integrated circuit according to claim 17, the semiconductor integrated circuit further comprising:

a second power supply line for supplying a second power source voltage different from the first power source voltage;

a third MOS transistor included among the plurality of the second conduction type MOS transistors, the third MOS transistor having a gate electrode, a first electrode, and a second electrode, the first electrode being electrically connected to the second power supply line, the third MOS transistor having a third threshold voltage; and a second pseudo power supply line electrically connected to the second electrode of the third MOS transistor, the second pseudo power line supplying the second power source voltage to the internal logic circuit, wherein said internal logic circuit having at least a fourth MOS transistor of the plurality of the second conduction type MOS transistors, the fourth MOS transistor having a substrate terminal and having a fourth threshold voltage lower than the third threshold voltage, and wherein the voltage supplying circuit supplied a predetermined voltage to the substrate terminal of the fourth MOS transistor according to the predetermined logic level of the test signal received at the first terminal.

* * * * *